United States Patent [19]

Yamanaka et al.

[11] Patent Number: 4,853,894
[45] Date of Patent: Aug. 1, 1989

[54] STATIC RANDOM-ACCESS MEMORY HAVING MULTILEVEL CONDUCTIVE LAYER

[75] Inventors: Toshiaki Yamanaka, Houya; Norio Suzuki, Koganei; Yoshio Sakai, Shiroyama; Yoshifumi Kawamoto, Shiroyama; Osamu Minato, Hinodemachi; Koichiro Ishibashi, Tokyo; Nobuyuki Moriwaki, Kodaira; Satoshi Meguro, Hinodemachi, all of Japan

[73] Assignee: Hitachi, Ltd., Tokyo, Japan

[21] Appl. No.: 71,749

[22] Filed: Jul. 9, 1987

[30] Foreign Application Priority Data

Jul. 9, 1986 [JP] Japan .................................. 61-159790

[51] Int. Cl.[4] .................. G11C 11/00; G11C 11/34
[52] U.S. Cl. ...................................... 365/154; 365/190;
365/53; 365/182; 357/40
[58] Field of Search ................. 365/154, 53, 51, 190,
365/189, 174, 182; 357/40-42

[56] References Cited

U.S. PATENT DOCUMENTS 3,518,494 6/1970 James ................................ 357/40 X
4,609,835 9/1986 Sakai et al. ........................ 365/154
4,653,025 3/1987 Minato et al. .................. 365/154 X
4,679,171 7/1987 Logwood et al. .............. 365/154 X
4,744,056 5/1988 Yu et al. .......................... 365/154 X

FOREIGN PATENT DOCUMENTS 55-72069 5/1980 Japan .

Primary Examiner—Stuart N. Hecker
Assistant Examiner—Alfonso Garcia
Attorney, Agent, or Firm—Antonelli, Terry & Wands

[57] ABSTRACT

A semiconductor memory having static cells each composed of two driver MOS transistors formed on a semiconductor substrate and two transfer MOS transistors and two load resistors, which are formed on the substrate and are connected to the drains of the driver MOS transistors, respectively. A conductive film for fixing the sources of the driver MOS transistors to a ground voltage is formed above the principal surface of the semiconductor substrate, and this conductive film defines one electrode of a capacitance element formed on the substrate. The conductive film is formed over the load resistors formed on the semiconductor substrate so as to constitute an electric field shield for the load resistors.

24 Claims, 7 Drawing Sheets

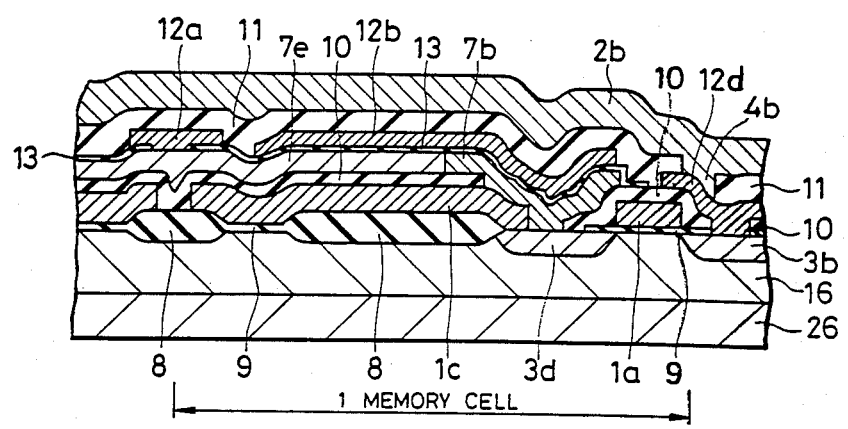
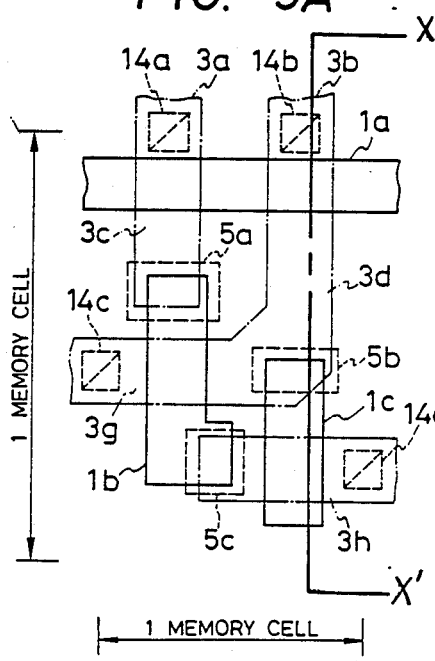
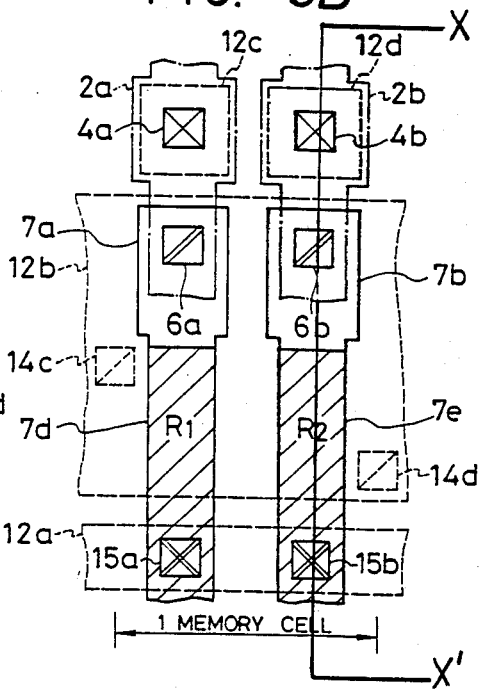

STATIC RANDOM-ACCESS MEMORY HAVING MULTILEVEL CONDUCTIVE LAYER

BACKGROUND OF THE INVENTION

The present invention relates to a semiconductor memory. More particularly, the present invention pertains to a semiconductor memory designed to achieve reduction in the cell area of a static random-access MOS memory and large immunity against soft errors induced by alpha particles.

A typical conventional flip-flop type static memory cell comprises two highly resistive loads and four n-channel MOS transistors, as described, for example, in Japanese Pat. Laid-Open No. 72069/1980. More specifically, as shown in FIG. 1, which is an equivalent circuit diagram, the drain of each of the pair of driver MOS transistors $T_1$ and $T_2$ is connected to the gate of the other of the two, and load resistors $R_1$ and $R_2$ are connected to the respective drains of the transistors. The sources of the transistors $T_1$ and $T_2$ are fixed to a predetermined voltage (e.g., a ground voltage), and a lower supply voltage Vcc is applied to the other ends of the resistors $R_1$ and $R_2$, thus supplying a very small current to a flip-flop circuit consisting of the transistors $T_1$, $T_2$ and the resistors $R_1$, $R_2$. Further, transfer MOS transistors $T_3$ and $T_4$ are respectively connected to storage nodes $N_1$ and $N_2$ of this flip-flop circuit. The above-described four transistors $T_1$, $T_2$, $T_3$, $T_4$ and two load resistors $R_1$, $R_2$ constitute in combination a memory cell for one bit. It should be noted that the reference numeral 1 denotes a word line, and 2a, 2b denote data lines. The load resistors $R_1$ and $R_2$ are generally formed using highly resistive polycrystalline silicon.

The related prior art will be described hereinunder in detail with reference to FIGS. 2, 3A and 3B. FIG. 2 shows a cross-sectional structure corresponding to the prior art shown in FIG. 1. Referring to FIG. 2, gate electrodes 1a and 1c of MOS transistors provided over a region 16 which is provided on a substrate 26 are formed from a first-level conductive layer, and a highly resistive load is formed from a highly resistive region 7e which is formed in a part of polycrystalline silicon that defines a second-level conductive layer. Low-resistive polycrystalline silicon regions 7b and 7c are provided at both ends, respectively, of the highly resistive region 7e, the silicon region 7c serving as a wiring for the power supply voltage Vcc, and the silicon region 7b being connected to a source diffusion region 3d of a transfer MOS transistor.

Diffusion regions 3b, 3d and 3f are used as sources or drains of the MO transistors.

The reference numerals 8, 9, 10 and 11 denote insulator films. The numeral 2b denotes a data line, and 4b a contact portion of the data line 2b.

FIGS. 3A and 3B show a planar layout of an arrangement for one bit, in which: FIG. 3A shows a layout of transfer MOS transistors and driver MOS transistors; and FIG. 3B shows a layout of highly resistive polycrystalline silicon. Referring to FIG. 3A, the word line 1a defines a common gate for the transfer MOS transistors $T_3$ and $T_4$. Data lines 2a and 2b formed from, for example, aluminum electrodes, are connected to the drain diffusion regions 3a and 3b of the MOS transistors $T_3$ and $T_4$ through contact holes 4a and 4b respectively. The gate electrodes 1b and 1c of the driver MOS transistors $T_1$ and $T_2$ are directly connected to the sources 3c and 3d of the MOS transistors $T_3$ and $T_4$ through contact holes 5a and 5b, respectively. The respective sources of the driver MOS transistors $T_1$ and $T_2$ are interconnected through a heavily-doped n-type diffusion layer (n+-layer) 3f. The n+-layer 3f is used to supply the ground voltage Vss to the sources of all the driver MOS transistors in the memory. As shown in FIG. 3B, the low-resistive polycrystalline silicon 7c is used to supply the power supply voltage Vcc to all the highly resistive loads in the memory.

In the figures, the reference numeral 5c denotes a contact hole for connecting together the diffusion layer and the gate electrode, 3e the drain diffusion region of the MOS transistor $T_2$, 6a, 6b contact holes for connecting together the diffusion layer or the gate electrode and second-level polycrystalline silicon, 7a, 7b, 7c second-level polycrystalline silicon regions, $R_1$, $R_2$ load resistances, and 7d, 7e highly resistive regions.

We have found that static memory cells having the above-described conventional structure suffer from the following problems:

(1) The n+-layer 3f which is employed as a wiring for supplying the ground voltage to the sources of the driver MOS transistors causes an increase in the longitudinal dimension of the memory. Further, the n+-layer 3f involves the problem that, when the memory is in an operative state, for example, a current flows to the driver MOS transistor $T_1$ from the data line 2a through the transfer MOS transistor $T_3$ in the arrangement shown in FIG. 1, and at this time, a voltage drop occurs between memory cells since the n+-layer has a relatively high sheet resistance, i.e., 20 to 100 $\Omega/\square$. In order to solve this problem, it has heretofore been necessary to provide one aluminum wiring per several cells and supply the ground voltage to the n+-layer through these aluminum wirings, which means that the aluminum wirings lead to an increase in the overall area of the memory chip.

(2) Very small amounts of uranium (U) and thorium (Th) are contained in a ceramic or resin material used to seal and package memory chips and also in a wiring material. The penetration of an alpha particle emitted by the decay of uranium and thorium atoms causes the generation of an electron-hole pair along the path of the particle. If one of the electron-hole pair is mixed into the charge stored at the storage nodes $N_1$, $N_2$, the potential at the nodes $N_1$, $N_2$ is undesirably changed, so that the storage information in the memory fails. This is a phenomenon known as "soft error". In conventional static memories, an amount of charge which is sufficient to compensate for a charge loss due to alpha particles can be stored by means of the P-N junction capacitance defined between the n+-diffusion layer constituting the drain regions of the driver MOS transistors $T_1$, $T_2$ and the p-type silicon substrate and the insulator film capacitance provided by the gate oxide film. However, as the memory cell area is reduced, it is impossible to store an amount of charge which is sufficient to compensate for a loss due to alpha particles. Accordingly, the conventional static memory structure involves the problem that miniaturization leads to an increase in the soft error rate and results in a considerable lowering in the reliability of the memory.

(3) Conductive characteristics of highly resistive polycrystalline silicon employed to form load resistors are determined by the potential barrier which is formed at the grain boundary. Accordingly, when a film which has a large amount of charge captured therein, such as a plasma nitride film, is employed as a protective film for a memory cell or when an electrode material such as an aluminum wiring is formed, the height of the potential barrier at the grain boundary in the highly resistive polycrystalline silicon may be changed, resulting in the resistance value of the load resistors being varied.

(4) Formation of a contact hole that connects together a data line and a transfer MOS transistor has a need in layout to ensure a margin for possible error in mask alignment between the contact hole and the gate electrode of the transfer MOS transistor, and this causes an increase in the longitudinal dimension of the memory cell, which makes it difficult to reduce the memory cell area.

SUMMARY OF THE INVENTION

The present invention aims at overcoming the above-described problems of the prior art.

Namely, it is an object of the present invention to provide a memory cell having a relatively small occupied area, and to provide a method of forming such memory cell.

It is another object of the present invention to provide a static type MOS random-access memory which is so designed that it is possible to suppress the incidence of soft errors due to alpha particles, and to provide a method of forming such memory.

These and other objects and many of the attendant advantages of this invention will be readily appreciated as the same becomes better understood by reference to the following detailed description when considered in connection with the accompanying drawings.

Generally, the present invention features that a conductive film for fixing the source of a driver MOS transistor to a ground voltage is formed above the principal surface of the semiconductor substrate and this conductive film defines one electrode of a capacitance element so as to supply the charge stored in this capacitance element to a storage node of the memory cell. Moreover, the present invention features methods of forming semiconductor devices, such as memory cells, having such conductive film which defines one electrode of such capacitance element.

If the arrangement is such that the above-described conductive film is formed over a load resistor so as to also serve as an electric field shield for the load resistor or the arrangement is such that said conductive film is defined by the same layer as that for a conductive film for supplying a power supply voltage to the memory and for a conductive film to which are connected the drains of transfer MOS transistors and data lines of the memory, there is no substantial increase in the production process, and it is possible to achieve higher integration and larger immunity against alpha particles.

BRIEF DESCRIPTION OF THE DRAWINGS

FIGS. 4 to 5B show in combination a first embodiment of the present invention.

DETAILED DESCRIPTION OF THE INVENTION

Figure 1:
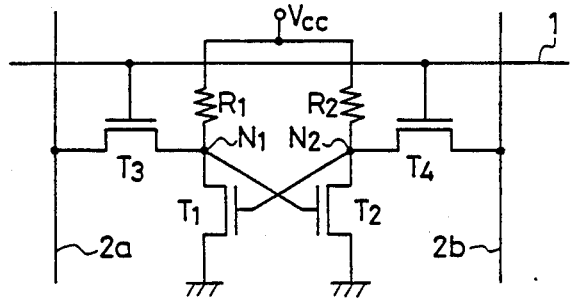
FIGS. 1 to 3B shown a prior art.
Figure 2:
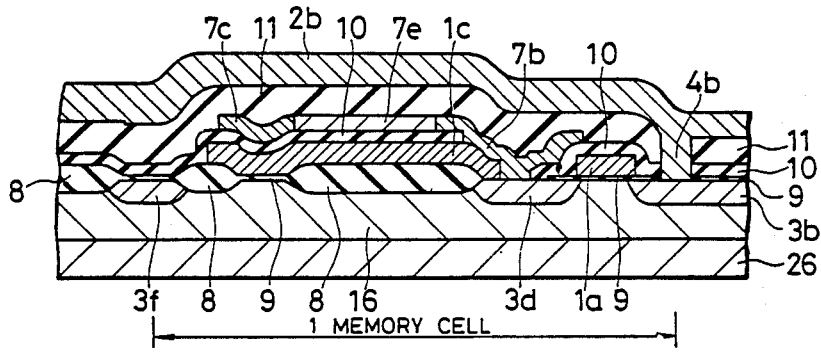
Figure 3A:
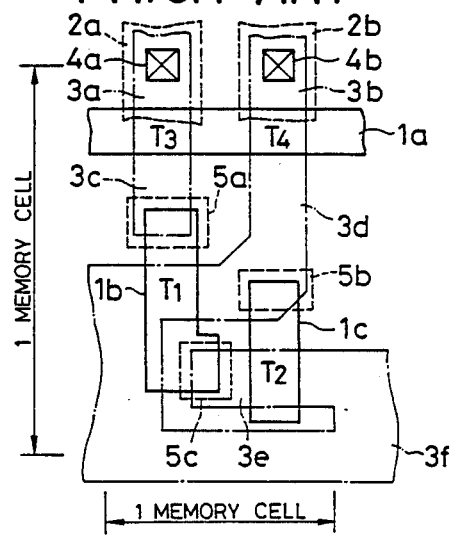
Figure 3B:
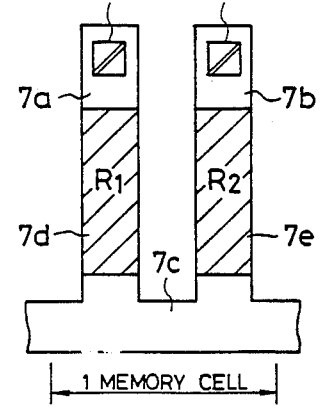
Figure 6A:
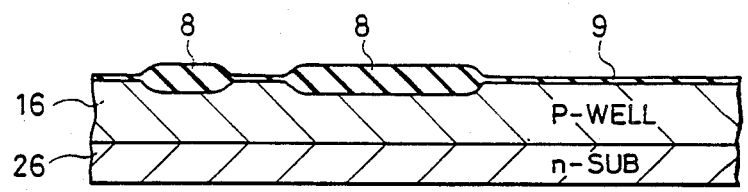
FIGS. 6A to 6F are sectional views respectively showing steps in a process for producing the first embodiment of the present invention.
Figure 6B:
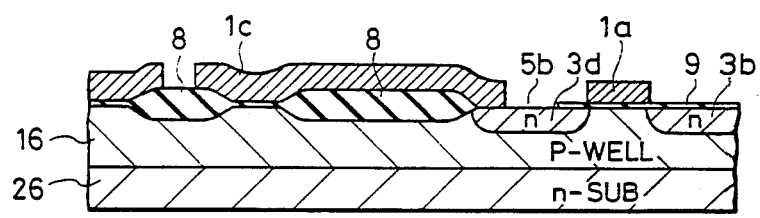
Figure 6C:
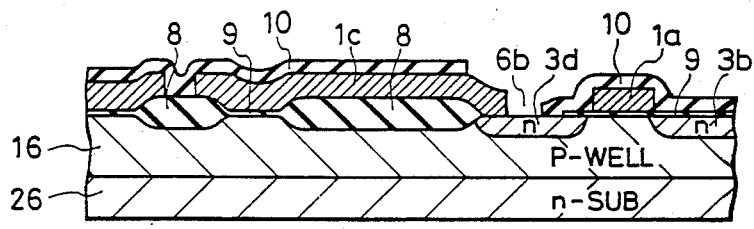
Figure 6D:
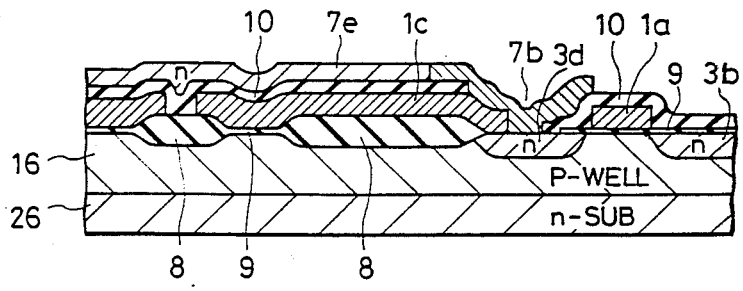
Figure 6E:
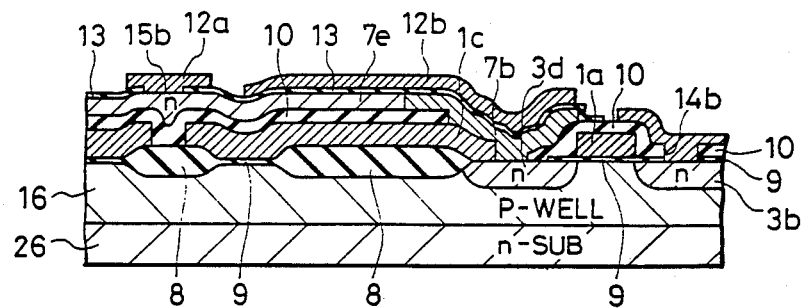
Figure 6F:
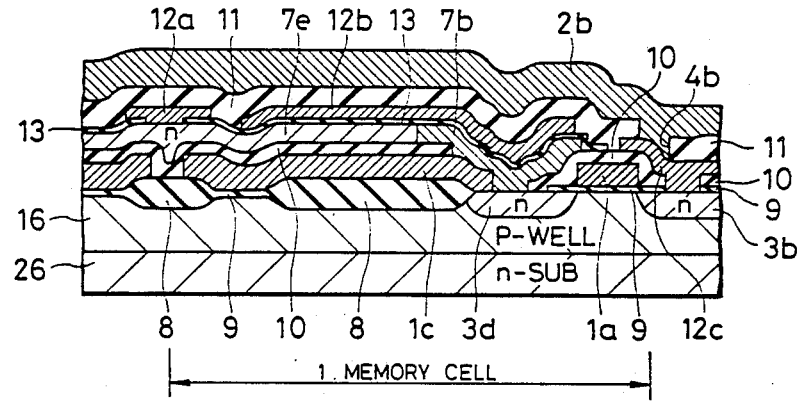

The present invention will be described hereinunder in detail by way of embodiments.

In the following embodiments, the same reference numerals denote the same or equal portions.

Embodiment 1

FIG. 4 shows a cross-sectional structure of a static type MOS memory cell according to the present invention. Referring to FIG. 4, a region 16 is provided on a substrate 26; then, using a first-level conductive layer defined by a conductive film such as a polycrystalline silicon film, refractory metal silicide film or refractory metal polycide film, formed over region 16, gate electrodes 1a and 1c of MOS transistors are provided over the region 16. The MOS transistors are electrically separated from each other by silicon oxide 8. The gate electrode 1c of the driver MOS transistor is connected directly to the source diffusion region 3d of the transfer MOS transistor through a hole provided in a gate oxide film 9 by partially etching it. A highly resistive load is constitute by a highly resistive region 7e formed in polycrystalline silicon which defines a second-level conductive layer. Supply f a current to the highly resistive region 7e is effected by connecting the third-level conductive film 12a directly to the highly resistive region 7e, and a very small current which is supplied from a power supply Vcc flows to the source diffusion region 3d of the transfer MOS transistor through a low-resistive region 7b. It should be noted that the third-level conductive films 12a and 12b may be formed using polycrystalline silicon or a refractory metal polycide. The third-level conductive film 12b is fixed to a ground voltage Vss and serves as an electric field shield for the highly resistive region 7e formed in the second-level layer. The highly resistive region 7e and a gate electrode 1c are isolated from each other by an intermediate insulator layer 10. The conductive film 12b cooperates with the second-level conductive film 7b and an intermediate insulator film 13 to constitute a capacitance element, thus enabling a charge to be supplied to the diffusion region 3d which defines a storage node. Further, a third-level conductive film 12d electrically connects together the drain diffusion region 3d of the transfer MOS transistor and an aluminum electrode 2b which defines a data line. The reference numeral 4b denotes a contact hole.

This embodiment will next be explained in more detail by the use of a planar layout. FIGS. 5A and 5B show a layout of this embodiment, in which: FIG. 5A shows a planar layout of the first-level conductive film, that is, the gate electrodes 1a and 1c; and FIG. 5B shows a planar layout of the second- and third-level conductive films and the aluminum electrodes. As can be appreciated, in the memory cell of this embodiment FIG. 4 is a sectional view of FIGS. 5A and 5B in stacked relationship (in the memory cell, FIGS. 5A and 5B are in a stacked relationship, with FIG. 5B above FIG. 5A), along the lines X—X' shown in FIGS. 5A and 5B. In this embodiment, as shown in FIGS. 5A and 5B, the sources 3g and 3h of the driver MOS transistors $T_1$ and $T_2$ are interconnected by the use of the third-level conductive film 12b and through contact holes 14c and 14d formed in the intermediate insulator film 10 interposed between the first- and second-level conductive films and the intermediate insulator film 13 between the second- and third-level conductive films. So, the source 3g and the source 3h are connected to each other. The third-level conductive film is fixed to the ground voltage Vss and is connected to the sources of all the driver MOS transistors in the memory. The third-level conductive films 12c and 12d are connected to the drains 3a and 3b of the transfer MOS transistors $T_3$ and $T_4$ through the contact holes 14a and 14b, respectively. Further, the aluminum electrodes 2a and 2b which define data lines are connected to the conductive films 12c and 12d through the contact holes 4a and 4b, respectively.

A process for producing the memory cell in accordance with this embodiment will next be explained in order of successive steps with reference to FIGS. 6A to 6F which are sectional views.

First, a p-type well 16 having an impurity concentration of $10^{15}$ to $10^{17}$ cm$^{-3}$ is formed in an n-type silicon substrate 26 with a (100) surface and having a resistivity of 10 Ω·cm by ion implantation and thermal diffusion using boron. Thereafter, a silicon oxide film 8 having a thickness of 100 to 1000 nm is formed by, for example, the LOCOS method in order to form MOS transistor isolating regions, and a gate oxide film 9 having a thickness of 10 to 100 nm is formed in a portion which defines an active region of a MOS transistor [see FIG. 6A]. Next, a contact hole 5b is formed in a part of the gate oxide film 9, and a conductive film such as polycrystalline silicon is processed by photolithography and dry etching to form gate electrodes 1a and 1c. Then, arsenic ions are implanted using the gate electrodes as masks to form an n-type impurity diffused layer [see FIG. 6B]. Next, an insulator film 10 such as $SiO_2$ is deposited to a thickness of 100 to 1000 nm, and a contact hole 6b is formed therein. Subsequently, polycrystalline silicon films 7e and 7b which define a second-level conductive layer are deposited to a thickness of 50 to 500 nm by the low pressure chemical vapor deposition (CVD) method and patterned by photolithography and dry etching. Then, thermal oxide having a thickness of 5 to 50 nm is formed on the surface of the polycrystalline silicon, and an n-type impurity such as arsenic is ion-implanted into a portion which is to become a low-resistive region 7b at a dose of $10^{14}$ to $10^{16}$ cm$^{-2}$ [see FIG. 6D]. Next, a silicon oxide film 13 having a thickness of 10 to 50nm, or a two-layer insulator film 13 which consists of a silicon nitride film and an oxide film and which has the same thickness, i.e., 10 to 50 nm, is formed on the second-level conductive layer, and partially opened to provide contact holes 14b and 15b. In forming the two-layer insulator layer 13, initially a silicon oxide film is formed, and then a silicon nitride film is formed over the silicon oxide film. Then, a polycrystalline silicon film (that is, a third-level polycrystalline film) is deposited to a thickness of 50 to 500 nm by the low pressure CVD method, thermal oxide having a thickness of 5 to 50 nm is formed, and an n-type impurity such as arsenic is then ion-implanted at a dose of $10^{14}$ to $10^{16}$ cm$^{-2}$; thereafter, conductive films 12a, 12b and 12c, which define a third-level conductive layer [see FIG. 6E], are formed from the doped polycrystalline film. Finally, a two-layer intermediate insulator film 11 consisting of a silicon oxide film and a silicon oxide film (PSG film) containing 0.5 to 4 mol % phosphorus is deposited to a thickness of 100 to 1000 nm by the CVD method. In forming the two-layer intermediate insulator film 11, initially the silicon oxide film is formed and then the PSG film is formed on the silicon oxide. After a contact hole 4b has been provided in the intermediate insulator film 11, an aluminum electrode 2b is formed to a thickness of 500 to 2000 nm [see FIG. 6F].

According to this embodiment, the third-level conductive layer which connects together the sources of a pair of driver MOS transistors is newly provided, whereby it becomes unnecessary to provide the n$^+$-diffusion region which has heretofore been needed, so that the longitudinal length in the memory cell dimensions can be reduced about 15%. Further, since the electrostatic capacity of a capacitance element which is defined by the above-described third-layer conductive film fixed to the ground voltage and the second-level conductive film connected to the storage node can be increased to 5 to 20 fF, it is possible to compensate for an amount of charge which is lost when the memory cell is irradiated with alpha particles and to thereby increase the immunity against soft errors induced by alpha particles. Further, since the highly resistive load which is formed in the second-level conductive film is shielded from electric field by the third-level conductive film which is grounded, there are less noise and less variations in resistance due to field effect exerted from the upper-level layers such as the aluminum electrode wiring, the intermediate insulator film used for the electrode wiring and the chip protecting film, and it is therefore possible to obtain a highly resistive load having an electrically stable resistance value.

Embodiment 2

Figure 7:
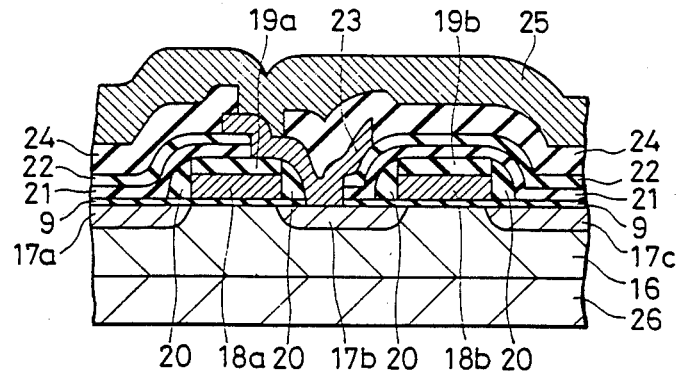
FIG. 7 is a sectional view of a second embodiment of the present invention.
Figure 8A:
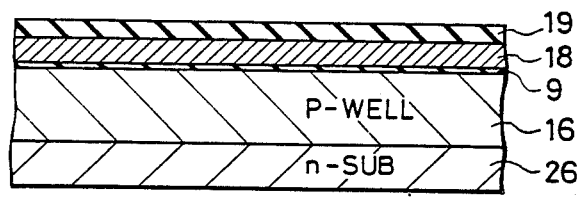
FIGS. 8A to 8E are sectional views respectively showing steps in a process for producing the second embodiment of the present invention.
Figure 8B:
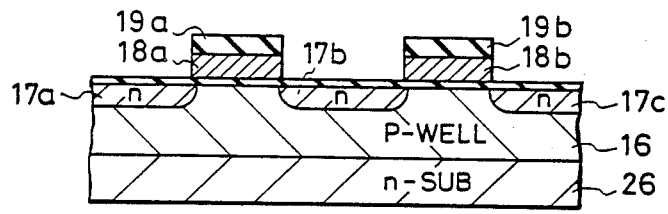
Figure 8C:
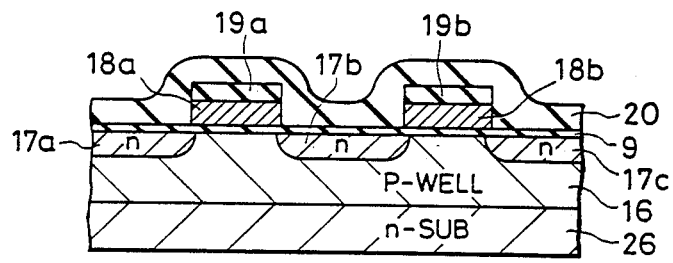
Figure 8D:
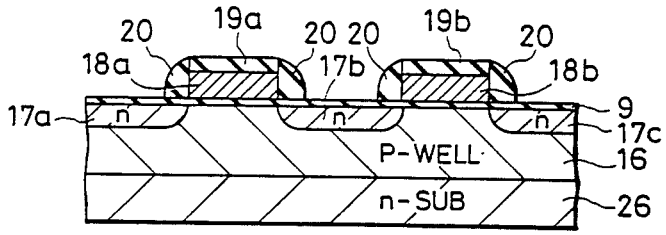
Figure 8E:
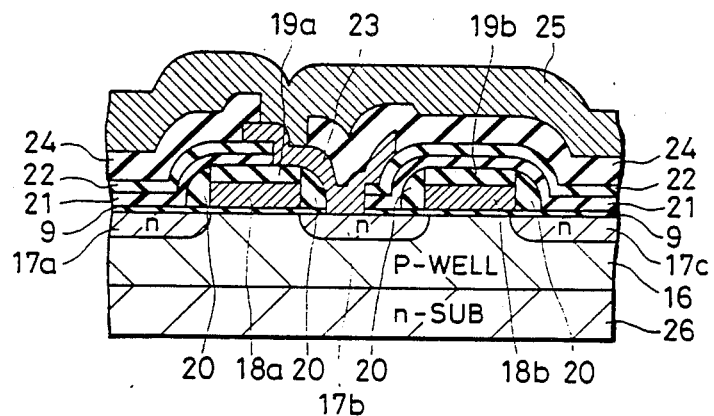

The feature of this embodiment resides in the structure for connecting together the drain diffusion region of the transfer MOS transistor and the third-level conductive film. FIG. 7 shows a cross-sectional structure of the transfer MOS transistor section in accordance with this embodiment, including a transfer MOS transistor of an adjacent cell. Referring to FIG. 7, gate electrodes 18a and 18b are insulated by means of insulator films 19a, 19b defined by the upper-level $SiO_2$ layer and insulator films 20 defined by side wall $SiO_2$ films. The sum of the thickness of an intermediate insulator film 21 such as $SiO_2$ which is interposed between the gate electrodes 18a, 18b defined by the first-level conductive film and the second-level conductive film and the thickness of an intermediate insulator film 22 such as $SiO_2$ which is interposed between the second-level conductive film and a third-level conductive film 23 formed from, for example, polycrystalline silicon is sufficiently smaller than the thickness of the above-described insulator films 19a, 19b and 20, so that formation of a contact hole in the insulator film above the gate electrode for connecting together the diffusion region 17b and the polycrystalline silicon film 23 involves no fear of the gate electrode 18a coming into contact with the third-level conductive film 23. A contact hole for connecting together an aluminum electrode 25 defining a data line and the polycrystalline silicon film 23 may be provided at any position above the film 23 and may be formed above the gate electrode 18a. Accordingly, it is unnecessary to take into consideration a margin for mask alignment between the contact hole and the gate electrode which margin has heretofore been needed to be provided in the prior art, and it is therefore possible to minimize the spacing between the word lines of each pair of adjacent cells (i.e., the spacing between the gate electrodes 18a and 18b). Thus, the longitudinal length in the memory cell dimensions can be reduced about 10%.

Steps in a process for producing this embodiment will be explained in order with reference to FIGS. 8A through 8E. The sectional views illustrating the manufacturing steps show two transfer MOS transistors which are adjacent to each other. First, in the same manner as in the embodiment 1, a gate oxide film 9 having a thickness of 10 to 100 nm is formed on that portion 16 in an n-type silicon substrate 26 which is to be an active region. Thereafter, a conductive film 18 such as a polycrystalline silicon film which is to define gate electrodes is deposited to a thickness of 100 to 500 nm by the low pressure CVD method. Subsequently, an insulator film 19 such as $SiO_2$ is deposited to a thickness of 50 to 500 nm by the low pressure CVD method [see FIG. 8A]. Next, an insulator film 19 is processed into gate electrode pattern by photolithography and reactive ion etching to form insulator films 19a and 19b, and the conductive film 18 is etched using the insulator films 19a and 19b as masks to form gate electrodes 18a and 18b. Thereafter, with the gate electrodes 18a and 18b used as masks, an n-type impurity such as arsenic is added by ion implantation to form heavily-doped impurity diffusion regions 17a, 17b and 17c which define source and drain regions of MOS transistors [see FIG. 8B]. Next, an $SiO_2$ film 20 having a thickness of 100 to 500 nm is deposited by the low pressure CVD method [see FIG. 8C], and the flat portions of the $SiO_2$ film 20 are removed by reactive ion etching to form side wall spacers 20 on the side edges of the gate electrodes 18a and 18b [see FIG. 8D]. Further, an intermediate insulator film 21 between the first-level gate electrodes 18, 18b and the second-level conductive film and an intermediate insulator film 22 between the second- and third-level conductive films are provided by depositing an $SiO_2$ film having a thickness of 50 to 300 nm by the low pressure CVD method. Thereafter, a contact hole is provided for connecting together the third-level conductive film 23 and the diffusion region 17b which is formed in the Si substrate, and the third-level conductive film 23 is then formed by depositing, for example, a polycrystalline silicon film to a thickness of 50 to 300 nm. It should be noted that the third-level conductive film 23 may be formed using a refractory metal, refractory metal silicide or refractory metal polycide [see FIG. 8E]. Next, a silicon dioxide film 24 containing 0.5 to 4 mol % phosphorus is deposited to a thickness of 100 to 1000 nm by the low pressure CVD method, and after a contact hole has been provided, an aluminum electrode 25 which defines a data line is formed to a thickness of 500 to 2000 nm.

It should be noted that, although in this embodiment the third-level conductive film is employed to connect together the aluminum electrode 25 and the diffusion region 17b of the MOS transistor, the second-level conductive film may similarly be employed.

Embodiment 3

Figure 9:
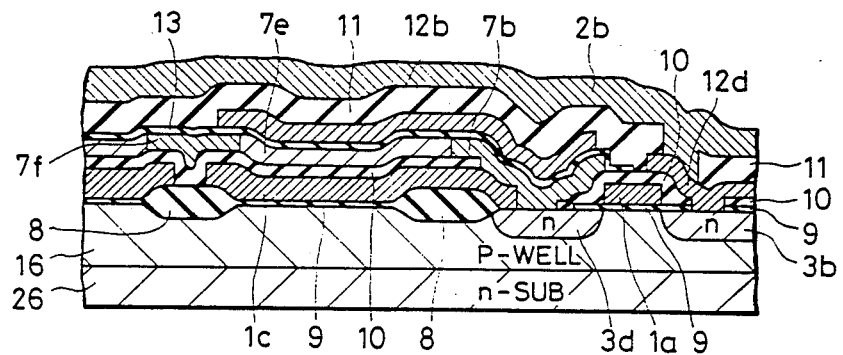
FIG. 9 is a sectional view of a third embodiment of the present invention.

In this embodiment, the wiring for the power supply voltage Vcc is formed using a second-level conductive film. FIG. 9 shows a cross-sectional structure of this embodiment. Referring to FIG. 9, a highly resistive region 7e and low-resistive regions 7b, 7f are formed in the second-level conductive film defined by polycrystalline silicon. The highly resistive region 7e is used to constitute a highly resistive load, while the low-resistive region 7b, the insulator film 13 and the third-level conductive film 12b constitute in combination a capacitance element, and the low-resistive region 7f defines a wiring for the power supply voltage Vcc. The low-resistive region 7f is used to supply the power supply voltage Vcc to each of the cells in the memory. The third-level conductive film 12b is connected to the source diffusion region of a MOS transistor through a contact hole and fixed to the ground voltage, and it covers the whole surface of the highly resistive polycrystalline silicon 7e formed in the second-level layer. Accordingly, it is possible to completely shield the highly resistive load from electric field.

Although in the above-described embodiment the third-level conductive film is employed as the grounding conductor, it is also possible to employ the second-level conductive film as described in the following embodiment 4.

Embodiment 4

Figure 10A:
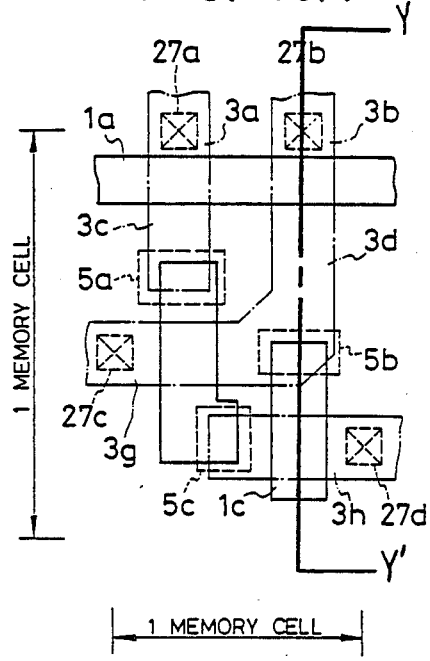
FIGS. 10A to 11 show a fourth embodiment of the present invention.
Figure 10B:
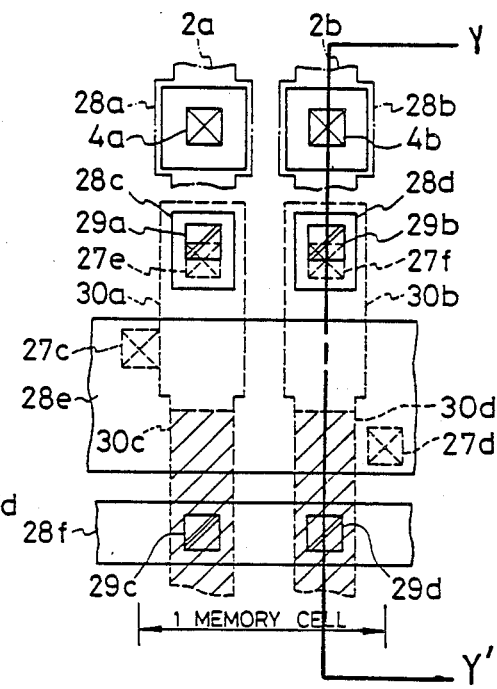
Figure 11:
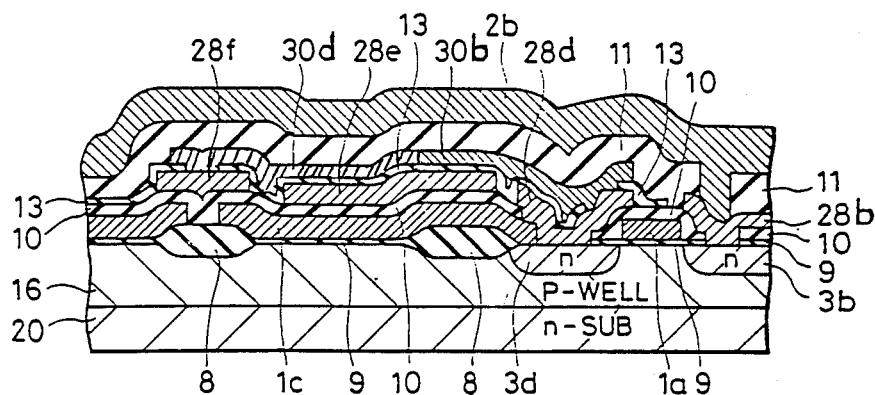

This embodiment relates to a static type MOS memory in which the second-level conductive film is employed to form a grounding conductor and the third-level conductive film is used to form a highly resistive load. FIGS. 10A and 10B show a planar layout of the memory cell in accordance with this embodiment, with FIG. 10A showing a planar layout of the first-level conductive film, that is, gate electrodes 1a and 1c, and FIG. 10B showing a planar layout of the second- and third-level conductive films and the aluminum electrodes. FIG. 11 shows a cross-sectional structure of the memory cell. As can be appreciated, in the memory cell of this embodiment FIG. 11 is a sectional view of FIGS. 10A and 10B in stacked relationship (in the memory cell, FIGS. 10A and 10B are in a stacked relationship, with FIG. 10B above FIG. 10A), along the lines Y—Y' shown in FIGS. 10A and 10B. Second-level conductive films 28a and 28b are connected to the drains 3a and 3b of transfer MOS transistors through contact holes 27a and 27b, respectively, and further connected to the aluminum electrodes 2a and 2b through the contact holes 4a and 4b, respectively. Second-level conductive films 28c and 28d are connected to the source diffusion regions 3c and 3d of the transfer MOS transistors and further to the gate electrodes 1b and 1c of the driver MOS transistors through contact holes 27e and 27f, respectively. The second-level conductive film 28e is connected to the sources 3g and 3h of the driver MOS transistors through contact holes 27c and 27d, respectively, thus applying the ground voltage Vss to the sources of all the driver MOS transistors in the memory. Further, the second-level conductive film 28f is employed as a wiring for supplying the power supply voltage Vcc. The third-level conductive films 30a and 30b are connected to the second-level conductive films 28c and 28d constituting storage nodes through contact holes 29a and 29b, respectively, thereby forming the upper-level electrode of a capacitance element. Thus, a capacitance element is constituted by the upper-level electrode, the insulator film 13 and the lower-level electrode 28e. The third-level conductive films 30c and 30d are formed from highly resistive polycrystalline silicon, constitute the load resistors for the memory cell of this embodiment, and are directly connected to the second-level wiring 28f for supplying the power supply voltage Vcc through contact holes 29c and 29d, respectively.

According to this embodiment, since the second-level conductive films are connected to the source and drain diffusion regions, respectively, of the MOS transistors, the thickness of the intermediate insulator film becomes smaller than that in the case of employing the third-level conductive film, and the manufacturing process is facilitated correspondingly. In addition, the degree of allowance with which the process is carried out increases. It should be noted that, in this embodiment, the second-level conductive films 28c and 28d may be omitted and the third-level conductive films 30a and 30b may be connected directly to the diffusion regions 3c and 3d of the MOS transistors through other contact holes, respectively. Further, the wiring for supplying the power supply voltage Vcc may be formed using the third-level conductive layer.

Although in the above embodiments the present invention has been described by way of n-channel MOS transistors fabricated in a p-type well which is formed in an n-type silicon substrate, it is also possible to employ n-channel MOS transistors formed in a p-type silicon substrate; in such a case also, similar advantageous effects can be produced.

As has been described above, it is possible, according to the present invention, to realize a static type MOS memory which can be formed with a high integration density and which has large immunity against soft errors induced by alpha particles.

It is further understood by those skilled in the art that the foregoing description is a preferred embodiment of the disclosed device and that various changes and modifications may be made in the invention without departing from the spirit and scope thereof.

What is claimed is:

1. A semiconductor memory having static cells each composed of two driver MOS transistors formed on a semiconductor substrate and two transfer MOS transistors and two load resistors, which are formed on said substrate and are connected to the drains of said driver MOS transistors, respectively, said memory further comprising a capacitance element formed on said substrate, said capacitance element having two electrodes being electrically connected in said memory so as to supply a charge stored in said capacitance element to a storage node of said memory, said memory also including a conductive film for fixing the sources of said driver MOS transistors to a ground voltage, said conductive film being formed above said semiconductor substrate, said conductive film defining one electrode of said capacitance element formed on said substrate, said memory further comprising a conductive film for supplying a power supply voltage to said memory, said conductive film for supplying a power supply voltage being electrically coupled to the load resistors, the other of the two electrodes of the capacitance element being electrically connected to the load resistors.

2. A semiconductor memory according to claim 1, wherein said conductive film is formed over said load resistors formed on said semiconductor substrate so as t constitute an electric field shield for said load resistors.

3. A semiconductor memory according to claim 1, further comprising a conductive film for supplying a power supply voltage to said memory, wherein said conductive film for fixing the sources of said driver MOS transistors to a ground voltage is formed in the same layer as said conductive film for supplying a power supply voltage to said memory.

4. A semiconductor memory according to claim 1, further comprising data lines, and a conductive film electrically connecting the drains of said transfer MOS transistors and said data lines, and wherein said conductive film for fixing the source of said driver MOS transistors to a ground voltage is formed in the same layer as said conductive film electrically connecting the drains of said transfer MOS transistors and said data lines.

5. A semiconductor memory according to claim 1, further comprising data lines, a conductive film for supplying a power supply voltage to said memory, and a conductive film electrically connecting the drains of said transfer MOS transistors and said data lines, and wherein said conductive film for fixing the sources of said driver MOS transistors to a ground voltage, said conductive film for supplying a power supply voltage to said memory, and said conductive film electrically connecting the drains of said transfer MOS transistors and said data lines, are formed in the same conductive layer.

6. A semiconductor memory according to claim 1, wherein gate electrodes of the driver MOS transistors are formed from a first-level conductive layer on the substrate, the two load resistors are formed from a second-level conductive layer over the first-level conductive layer, and said conductive film is formed from a third-level conductive layer, also over the first-level conductive layer.

7. A semiconductor memory according to claim 6, wherein said third-level conductive layer is formed over the second-level conductive layer, whereby the conductive film is formed from a conductive layer over the load resistors.

8. A semiconductor memory according to claim 7, further comprising data lines, and a further conductive film electrically connecting the drains of said transfer MOS transistors and said data lines, said further conductive film being formed of one of said second-level conductive layer and said third-level conductive layer.

9. A semiconductor memory according to claim 8, wherein said further conductive film is formed of said third-level conductive layer.

10. A semiconductor memory according to claim 9, further comprising insulating films surrounding the gate electrodes of the transfer MOS transistors, a further insulating film between the gate electrodes of the transfer MOS transistors and the second-level conductive layer, and a still further insulating film between the second-level conductive layer and the third-level conductive layer, the sum of the thicknesses of said further insulating film and still further insulating film being smaller than the thickness of the insulating films surrounding the gate electrodes of the transfer MOS transistors.

11. A semiconductor memory according to claim 10, wherein the insulating films surrounding the gate electrodes of the transfer MOS transistors include first insulating films on the gate electrodes and second insulating films at the side of the gate electrodes.

12. A semiconductor memory according to claim 10, wherein the further conductive film directly electrically connects to the drains of said transfer MOS transistors and directly electrically connects to the data lines, and wherein the electrical connection between the data line and further conductive film is over the gate electrode of a transfer MOS transistor.

13. A semiconductor memory according to claim 10, wherein said data line and said further conductive film are in direct electrical connection, the electrical connection being over the gate electrode of a transfer MOS transistor.

14. A semiconductor memory according to claim 6, wherein said second-level conductive layer is formed over the third-level conductive layer, whereby the load resistors are formed from a conductive layer over said conductive film.

15. A semiconductor memory according to claim 14, including a further conductive film, formed of said second-level conductive layer, and adapted to supply a power supply voltage to the memory.

16. A semiconductor memory according to claim 15, wherein the further conductive film is electrically connected to a still further conductive film, formed from the third-level conductive layer, so as to supply a power supply voltage to the memory.

17. A semiconductor memory comprising:
first and second driver MOS transistors, first and second transfer MOS transistors, and first and second load resistors;
the gate electrode of said first driver MOS transistor, one terminal of said second load resistor, one of the source and drain of said second transfer MOS transistor and one of the drain source of said second driver MOS transistor being electrically connected together;
the gate electrode of said second driver MOS transistor, one terminal of said first load resistor, one of the source and drain of said first transfer MOS transistor and one of the drain and source of said first driver MOS transistor being electrically connected together;
the other terminals of said first and second load resistors being connected to a first predetermined power supply line;
the gate electrodes of said first and second transfer MOS transistors being mutually defined by a first-level conductive layer including polycrystalline silicon, said gate electrodes acting as a word line;
one of the sources and drains of each of said first and second driver MOS transistors being mutually connected to a second predetermined power supply line;
one of the drains and sources of each of said first and second transfer MOS transistors being connected to first and second data lines, respectively;
said first and second load resistors being defined by a second-level conductive layer including polycrystalline silicon;
said first or second predetermined power supply line being defined by a third-level conductive layer including polycrystalline silicon; and
said second- and third-level conductive layers including polycrystalline silicon forming in combination a capacitance element, said capacitance element being electrically connected in said memory so as to supply a charge stored in said capacitance element to a storage node of said memory.

18. A semiconductor memory comprising:
first and second driver MOS transistors, first and second transfer MOS transistors, and first and second load resistors;
the gate electrode of said first driver MOS transistor, one terminal of said second load resistor, one of the source and drain of said second transfer MOS transistor and one of the drain and source of said second driver MOS transistor being electrically connected together;
the gate electrode of said second driver MOS transistor, one terminal of said first load resistor, one of the source and drain of said first transfer MOS transistor and one of the drain and source of said first driver MOS transistor being electrically connected together;
the other terminals of said first and second load resistors being connected to a first predetermined power supply line;
the gate electrodes of sad first and second transfer MOS transistors being mutually defined by a first-level conductive layer including polycrystalline silicon, said gate electrode acting as a word line;
one of the sources and drains of each of said first and second driver MOS transistors being mutually connected to a second predetermined power supply line;
one of the drains and sources of each of said first and second transfer MOS transistors being connected to first and second data lines, respectively;
said first and second load resistors and said second predetermined power supply line being defined by a second-level conductive layer including polycrystalline silicon;
said first predetermined power supply line being defined by a third-level conductive layer including polycrystalline silicon; and
said second- and third-level conductive layers including polycrystalline silicon forming in combination a capacitance element, said capacitance element being electrically connected in said memory so as to supply a charge stored in said capacitance element to a storage node of said memory.

19. A semiconductor memory comprising:
first and second driver MOS transistors, first and second transfer MOS transistors, and first and second load resistors;
the gate electrode of said first driver MOS transistor, one terminal of said second load resistor, one of the source and drain of said second transfer MOS transistor, and one of the drain and source of said second driver MOS transistor being electrically connected together;
the gate electrode of said second driver MOS transistor, one terminal of said first load resistor, one of the source and drain of said first transfer MOS transistor, and one of the drain and source of said first driver MOS transistor being electrically connected together;
the other terminals of said first and second load resistors being connected to a first predetermined power supply line;
the gate electrodes of said first and second transfer MOS transistors being mutually defined by a first-level conductive layer including polycrystalline silicon, said gate electrodes acting as a word line;
one of the sources and drains of each of said first and second driver MOS transistors being mutually connected to a second predetermined power supply line;
one of the drains and sources of each of said first and second transfer MOS transistors being connected to first and second data lines, respectively;
said first and second load resistors being defined by a third-level conductive layer including polycrystalline silicon;

said first or second predetermined power supply line being defined by a second-level conductive layer including polycrystalline silicon; and said second- and third-level conductive layers including polycrystalline silicon forming in combination a capacitance element, said capacitance element being electrically connected in said memory so as to supply a charge stored in said capacitance element to a storage node of said memory.

20. A semiconductor memory according to claim 1, wherein the capacitance element is formed over said load resistors.

21. A semiconductor memory according to claim 20, wherein said conductive film defining one electrode of said capacitance element defines the upper electrode of said capacitance element.

22. A semiconductor memory according to claim 21, wherein the load resistors are formed from a second-level conductive layer over the substrate, with the lower electrode of said capacitance element also being formed from said second-level conductive layer.

23. A semiconductor memory according to claim 1, wherein said conductive film defining one electrode of said capacitance element defines the upper electrode of said capacitance element.

24. A semiconductor memory according to claim 23, wherein the load resistors are formed from a second-level conductive layer over the substrate, with the lower electrode of said capacitance element aids being formed from said second-level conductive layer.

* * * * *